(12) United States Patent
Choi

(10) Patent No.: US 11,088,215 B2
(45) Date of Patent: Aug. 10, 2021

(54) ORGANIC LIGHT-EMITTING DISPLAY APPARATUS

(71) Applicant: Samsung Display Co., Ltd., Yongin-Si (KR)

(72) Inventor: Chulhyun Choi, Yongin-si (KR)

(73) Assignee: SAMSUNG DISPLAY CO., LTD.

( * ) Notice: Subject to any disclaimer, the term of this patent is extended or adjusted under 35 U.S.C. 154(b) by 0 days.

(21) Appl. No.: 16/827,994

(22) Filed: Mar. 24, 2020

(65) Prior Publication Data

US 2020/0365665 A1 Nov. 19, 2020

(30) Foreign Application Priority Data

May 16, 2019 (KR) .................. 10-2019-0057606

(51) Int. Cl.
*H01L 27/32* (2006.01)

(52) U.S. Cl.
CPC ...... *H01L 27/3218* (2013.01); *H01L 27/3216* (2013.01); *H01L 27/3246* (2013.01)

(58) Field of Classification Search
None
See application file for complete search history.

(56) References Cited

U.S. PATENT DOCUMENTS

| 9,805,651 | B2 | 10/2017 | Kim |
| 10,304,388 | B2 | 5/2019 | Lee et al. |
| 10,347,188 | B2 | 7/2019 | Moon |
| 2017/0053971 | A1* | 2/2017 | Sato ............. H01L 51/5275 |
| 2018/0076273 | A1 | 3/2018 | Kim et al. |
| 2018/0218684 | A1 | 8/2018 | Choi et al. |
| 2018/0350841 | A1 | 12/2018 | Lee et al. |

FOREIGN PATENT DOCUMENTS

| KR | 10-1373484 | 3/2014 |
| KR | 10-2015-0010384 | 1/2015 |
| KR | 10-2015-0144893 | 12/2015 |
| KR | 10-2017-0115150 | 10/2017 |
| KR | 10-2017-0141304 | 12/2017 |
| KR | 10-2018-0030363 | 3/2018 |
| KR | 10-2018-0089928 | 8/2018 |
| KR | 10-2018-0110258 | 10/2018 |

* cited by examiner

*Primary Examiner* — Jay C Chang
(74) *Attorney, Agent, or Firm* — H.C. Park & Associates, PLC

(57) ABSTRACT

An organic light-emitting display apparatus in which a plurality of pixels are arranged in a first direction and a second direction crossing the first direction includes: an organic light-emitting device disposed on a substrate, wherein the organic light-emitting device is included in each of the plurality of pixels; a pixel-defining film covering edges of a pixel electrode of the organic light-emitting device and having an opening exposing a portion of the pixel electrode to define an emission region; and a conductive layer between the substrate and the organic light-emitting device. The conductive layer includes first extension portions extending in the first direction and second extension portions extending in the second direction. The emission region of each of the plurality of pixels overlaps one of cross portions where the first extension portions and the second extension portions cross each other.

17 Claims, 12 Drawing Sheets

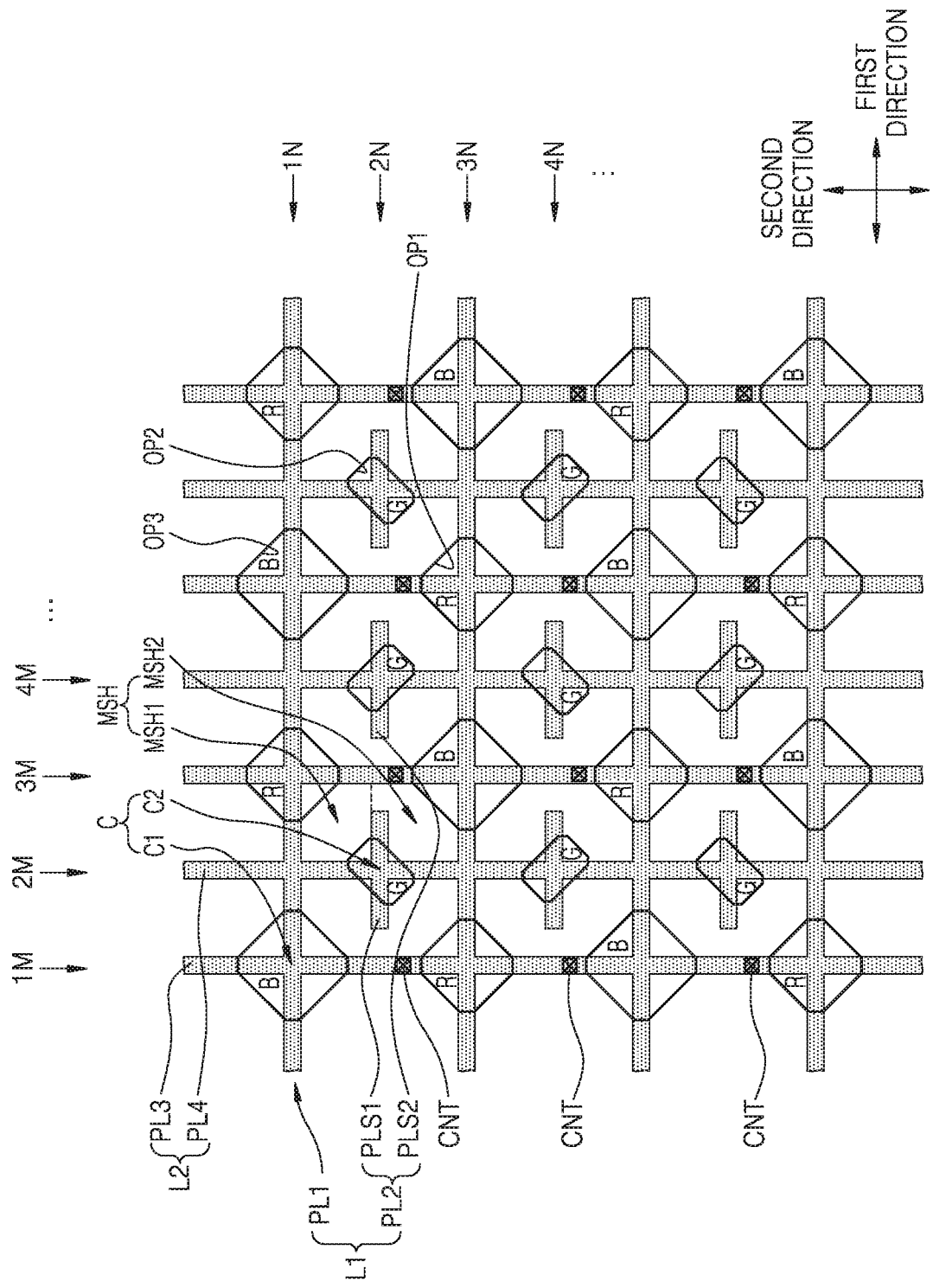

ORGANIC LIGHT-EMITTING DISPLAY APPARATUS

CROSS REFERENCE TO RELATED APPLICATION

This application claims priority from and the benefit of Korean Patent Application No. 10-2019-0057606, filed on May 16, 2019, which is hereby incorporated by reference for all purposes as if fully set forth herein.

BACKGROUND

Field

Exemplary embodiments/implementations of the invention relate generally to an organic light-emitting display apparatus.

Discussion of the Background

In general, an organic light-emitting display apparatus includes two electrodes and an organic emission layer therebetween, and electrons injected from a cathode, which is one of the two electrodes, and holes injected from an anode, which is the other electrode, combine in the organic emission layer to form excitons, and excitons release energy to emit light.

The organic light-emitting display apparatus includes a plurality of pixels including an organic light-emitting device (OLED) including the cathode, the anode, and the organic emission layer, and each pixel includes a plurality of transistors for driving the OLED and a capacitor. The plurality of transistors basically include a switching transistor and a driving transistor. Such an organic light-emitting display apparatus has advantages such as a high response speed and low power consumption.

As resolution increases, the OLED, the plurality of transistors for driving the OLED, the capacitor, and wires for transmitting signals to these elements are arranged to overlap each other, and thus, various issues may occur.

The above information disclosed in this Background section is only for understanding of the background of the inventive concepts, and, therefore, it may contain information that does not constitute prior art.

SUMMARY

Devices constructed according to exemplary embodiments of the invention are capable of providing an organic light-emitting display apparatus in which a characteristic difference between pixels may be decreased, an asymmetric color shift phenomenon may be decreased, and excellent visibility may be obtained.

Additional features of the inventive concepts will be set forth in the description which follows, and in part will be apparent from the description, or may be learned by practice of the inventive concepts.

According to one or more embodiments, an organic light-emitting display apparatus in which a plurality of pixels are arranged in a first direction and a second direction crossing the first direction includes: an organic light-emitting device disposed on a substrate, wherein the organic light-emitting device is included in each of the plurality of pixels; a pixel-defining film covering edges of a pixel electrode of the organic light-emitting device and having an opening configured to expose a portion of the pixel electrode to define an emission region; and a conductive layer disposed between the substrate and the organic light-emitting device, wherein the conductive layer includes first extension portions extending in the first direction and second extension portions extending in the second direction, wherein the emission region of each of the plurality of pixels overlaps one of cross portions where the first extension portions and the second extension portions cross each other.

The plurality of pixels may include a first pixel, a second pixel, and a third pixel emitting different colors of light from one another, and emission regions of the first pixel, emission regions of the second pixel, and emission regions of the third pixel may each overlap the cross portions.

The first pixel and the second pixel may be alternately arranged in the first direction and the second direction, and the third pixel may be disposed at a central point of a virtual quadrilateral having a central point of the first pixel and a central point of the second pixel as vertices.

The organic light-emitting display apparatus may further include: a thin film transistor disposed on the substrate; and a first via layer and a second via layer stacked between the thin film transistor and the organic light-emitting device, wherein: the conductive layer may be disposed between the first via layer and the second via layer the second extension portions may each include a third wire portion and a fourth wire portion alternating with the third wire portion, the third wire portion may include first cross portions crossing the first extension portions, and wherein the emission regions of the first pixel or the emission regions of the second pixel may each overlap one of the first cross portions.

Central points of the emission regions of the first pixel or central points of the emission regions of the second pixel may each overlap one of the first cross portions.

The organic light-emitting display apparatus may further include: a thin film transistor over the substrate; and a first via layer and a second via layer stacked between the thin film transistor and the organic light-emitting device, wherein the conductive layer may be disposed between the first via layer and the second via layer, the second extension portions may each include a third wire portion and a fourth wire portion alternating with the third wire portion, the fourth wire portion may include second cross portions crossing the first extension portions, and the emission regions of the third pixel may each overlap one of the second cross portions.

Central points of the emission regions of the third pixel may respectively overlap the second cross portions.

The first extension portions may include first wire portions and second wire portions alternating with the first wire portions, the emission regions of the first pixel or the emission regions of the second pixel may each overlap one of the first wire portions, the emission regions of the third pixel may each overlap one of the second wire portions, and the second wire portions may each include a first sub-portion and a second sub-portion spaced apart from each other in the first direction.

The conductive layer may include a wire for transmitting a driving voltage to the plurality of pixels.

The first direction and the second direction may be perpendicular to each other.

A central point of the emission region of each of the plurality of pixels may overlap one of the cross portions.

The plurality of pixels may include a first pixel, a second pixel, and a third pixel emitting different colors of light from one another, and a central point of an emission region of the first pixel, a central point of an emission region of the second pixel, and a central point of an emission region of the third pixel may each overlap one of the cross portions.

The plurality of pixels may be arranged in a pentile matrix structure.

The organic light-emitting display apparatus may further include: a first via layer and a second via layer disposed between the substrate and the pixel electrode; and a lower conductive layer disposed between the substrate and the first via layer, wherein: the conductive layer may be disposed between the first via layer and the second via layer, and the conductive layer may be configured to contact the lower conductive layer via a contact hole.

According to one or more embodiments, an organic light-emitting display apparatus in which a plurality of pixels are arranged in a first direction and a second direction crossing the first direction includes: an organic light-emitting device disposed on a substrate, wherein the organic light-emitting device is included in each of the plurality of pixels; a pixel-defining film covering edges of a pixel electrode of the organic light-emitting device and having an opening configured to expose a portion of the pixel electrode to define an emission region; a first via layer and a second via layer disposed between the substrate and the pixel electrode; and a conductive layer disposed between the first via layer and the second via layer, wherein the conductive layer has a mesh structure including mesh holes formed by first extension portions and second extension portions crossing each other, wherein emission regions of the plurality of pixels include overlap portions with respect to a first corner portion of the mesh holes and a second corner portion facing the first corner portion, respectively.

Central points of the emission regions of the plurality of pixels may overlap the conductive layer.

The plurality of pixels may include a first pixel, a second pixel, and a third pixel emitting different colors of light from one another.

At least one first mesh hole and a second mesh hole adjacent to the first mesh hole from among the mesh holes may be connected to each other in the second direction.

The organic light-emitting display apparatus may further include a lower conductive layer disposed between the substrate and the first via layer, wherein the conductive layer may be between the first via layer and the second via layer, wherein the conductive layer may be configured to contact the lower conductive layer via a contact hole.

A lower surface of the pixel electrode over the conductive layer may include a curve.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 7 is a schematic diagram of an organic light-emitting display apparatus according to another exemplary embodiment.

DETAILED DESCRIPTION

Figure 1:
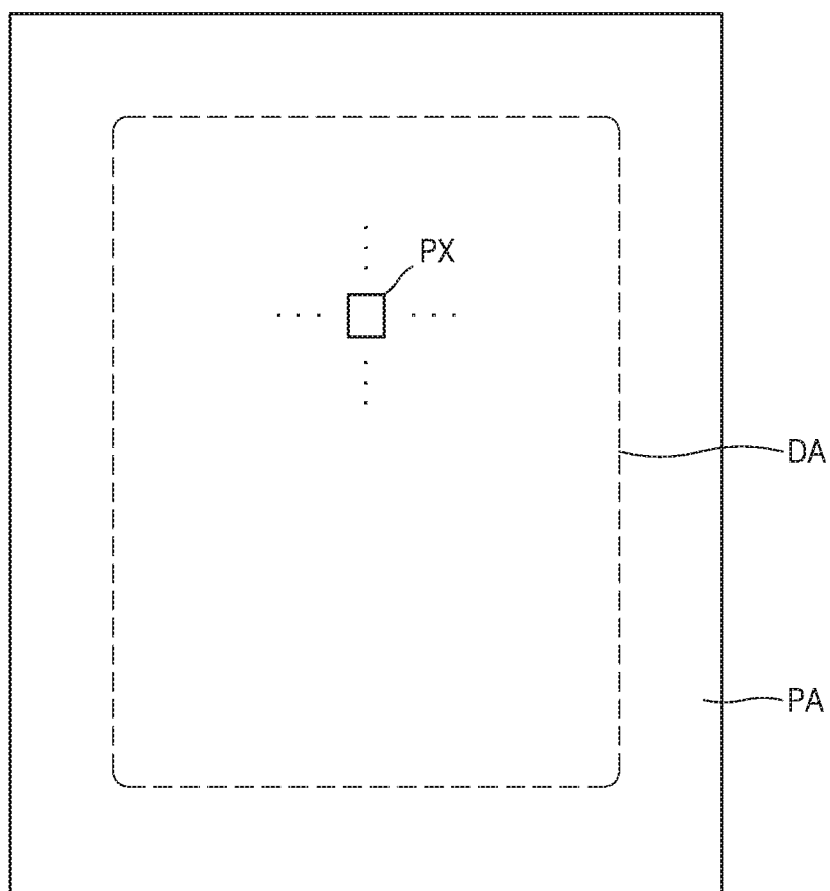
FIG. 1 is a schematic plan view of an organic light-emitting display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described in terms of functional blocks, units, and/or modules, such as scan and data drivers. Those skilled in the art will appreciate that these blocks, units, and/or modules are physically implemented by electronic circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic plan view of an organic light-emitting display apparatus according to an embodiment.

Referring to FIG. 1, the organic light-emitting display apparatus includes a display area DA where an image is displayed and a peripheral area PA, which is a surrounding non-display area. A plurality of pixels PX are arranged over the display area DA to provide a certain image.

Each pixel PX emits, for example, red, green, blue, or white light, and includes an organic light-emitting device OLED. Also, each pixel PX may further include devices such as a thin film transistor and a capacitor.

A pixel PX described herein refers to a sub-pixel which emits one of red light, green light, blue light, and white light as described above.

The peripheral area PA, which is an area where no image is provided, may include a scan driver and a data driver for providing electric signals that will be applied to pixels PX of the display area DA and power lines for providing power such as a driving voltage and a common voltage. Also, the peripheral area PA may include a terminal portion to which a printed circuit board, etc. may be connected.

Figure 2A:
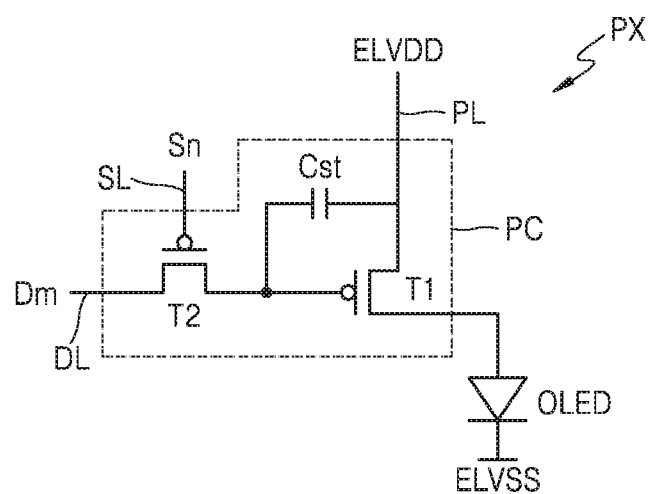
FIGS. 2A and 2B are equivalent circuit diagrams of a pixel of an organic light-emitting display apparatus according to an exemplary embodiment.
Figure 2B:
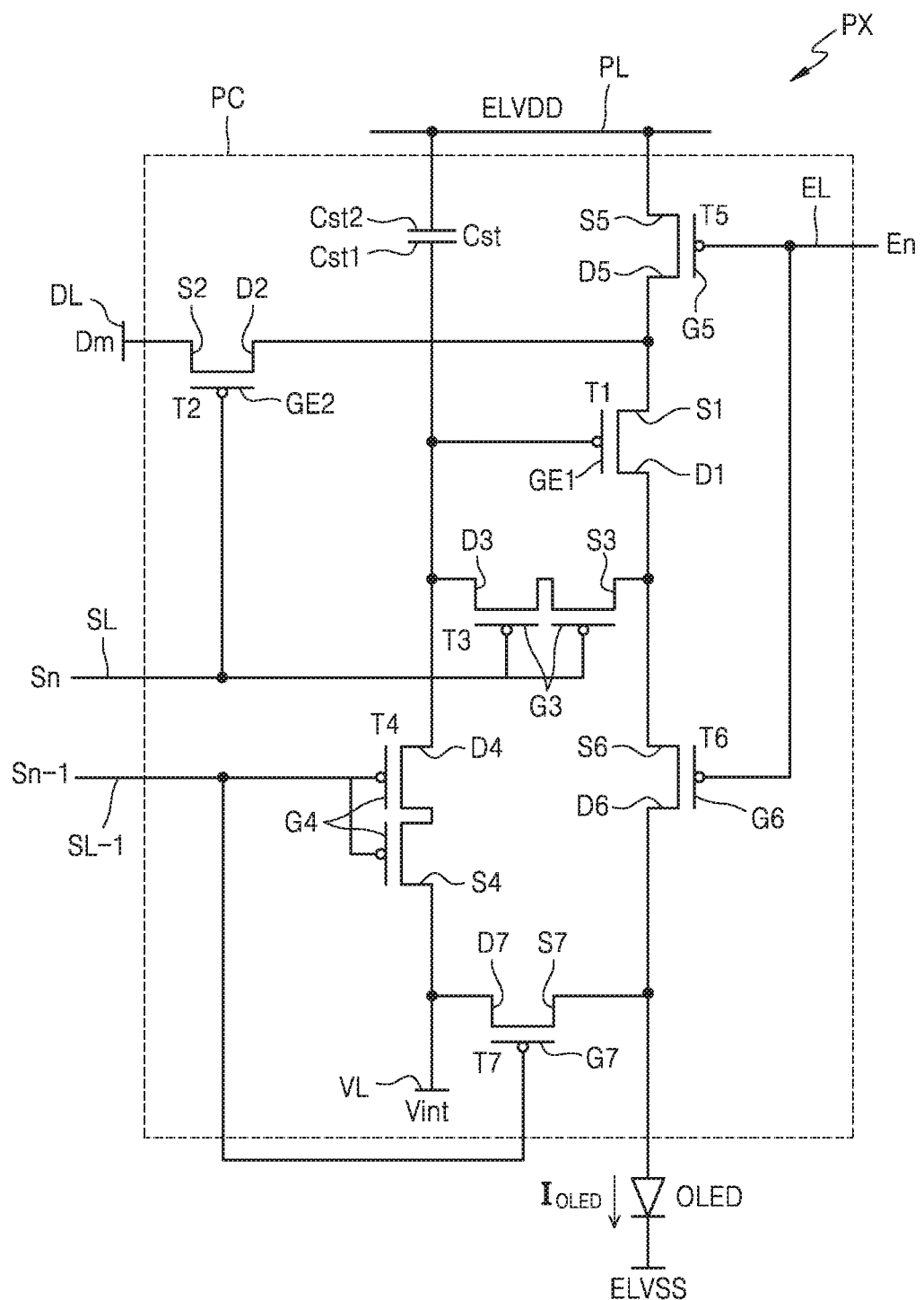

FIGS. 2A and 2B are schematic circuit diagrams of the pixel PX included in an organic light-emitting display apparatus according to an embodiment.

Referring to FIG. 2A, each pixel PX includes a pixel circuit PC connected to a scan line SL and a data line DL, and the organic light-emitting device OLED connected to the pixel circuit PC.

The pixel circuit PC includes a driving thin film transistor T1, a switching thin film transistor T2, and a storage capacitor Cst. The switching thin film transistor T2 is connected to the scan line SL and the data line DL and transmits a data signal Dm input through the data line DL to the driving thin film transistor T1 according to a scan signal Sn input through the scan line SL.

The storage capacitor Cst is connected to the switching thin film transistor T2 and a driving voltage line PL and stores a voltage corresponding to a difference between a voltage received from the switching thin film transistor T2 and a first power voltage ELVDD (or a driving voltage) supplied to the driving voltage line PL.

The driving thin film transistor T1 is connected to the driving voltage line PL and the storage capacitor Cst and may control a driving current flowing from the driving voltage line PL through the organic light-emitting device OLED in response to a voltage value stored in the storage capacitor Cst. The organic light-emitting device OLED may emit light having certain brightness according to the driving current.

Although FIG. 2A shows the pixel circuit PC including two thin film transistors and one storage capacitor, embodiments are not limited thereto. Various modifications may be made, for example, the pixel circuit PC may include three or more thin film transistors and/or two or more storage capacitors. As an example, the pixel circuit PC may include seven thin film transistors and one storage capacitor as shown in FIG. 2B.

Referring to FIG. 2B, each pixel PX includes the pixel circuit PC and the organic light-emitting device OLED connected to the pixel circuit PC. The pixel circuit PC may include a plurality of thin film transistors and a storage capacitor. The thin film transistors and the storage capacitor may be connected to signal lines SL, SL-1, EL, and DL, an initialization voltage line VL, and the driving voltage line PL.

Although FIG. 2B shows each pixel PX connected to the signal lines SL, SL-1, EL, and DL, the initialization voltage line VL, and the driving voltage line PL, embodiments are not limited thereto. According to another embodiment, at least one of the signal lines SL, SL-1, EL, and DL, the initialization voltage line VL, the driving voltage line PL, etc. may be shared between neighboring pixels.

The plurality of thin film transistors may include the driving thin film transistor T1, the switching thin film transistor T2, a compensation thin film transistor T3, a first initialization thin film transistor T4, an operation control thin film transistor T5, an emission control thin film transistor T6, and a second initialization thin film transistor T7.

The signal lines include the scan line SL transmitting the scan signal Sn, a previous scan line SL-1 transmitting a previous scan signal Sn-1 to the first initialization thin film transistor T4 and the second initialization thin film transistor T7, an emission control line EL transmitting an emission control signal En to the operation control thin film transistor T5 and the emission control thin film transistor T6, and the data line DL crossing the scan line SL and transmitting the data signal Dm. The driving voltage line PL transmits the driving voltage ELVDD to the driving thin film transistor T1, and the initialization voltage line VL transmits an initialization voltage Vint for initializing the driving thin film transistor T1 and a pixel electrode.

A driving gate electrode GE1 of the driving thin film transistor T1 is connected to a lower electrode Cst1 of the storage capacitor Cst. A driving source electrode S1 of the driving thin film transistor T1 is connected to the driving voltage line PL via the operation control thin film transistor T5. A driving drain electrode D1 of the driving thin film transistor T1 is electrically connected to a pixel electrode of the organic light-emitting device OLED via the emission control thin film transistor T6. As the data signal Dm is transmitted to the driving thin film transistor T1 according to a switching operation of the switching thin film transistor T2, the driving thin film transistor T1 supplies a driving current $I_{OLED}$ to the organic light-emitting device OLED.

A switching gate electrode GE2 of the switching thin film transistor T2 is connected to the scan line SL. A switching source electrode S2 of the switching thin film transistor T2 is connected to the data line DL. A switching drain electrode D2 of the switching thin film transistor T2 is connected to the driving source electrode S1 of the driving thin film transistor T1 and is connected to the driving voltage line PL via the operation control thin film transistor T5. As the switching thin film transistor T2 is turned on according to the scan signal Sn received through the scan line SL, the switching thin film transistor T2 performs a switching operation for transmitting the data signal Dm transmitted through the data line DL to the driving source electrode S1 of the driving thin film transistor T1.

A compensation gate electrode G3 of the compensation thin film transistor T3 is connected to the scan line SL. A compensation source electrode S3 of the compensation thin film transistor T3 is connected to the driving drain electrode D1 of the driving thin film transistor T1 and is connected to one electrode of the organic light-emitting device OLED via the emission control thin film transistor T6. A compensation drain electrode D3 of the compensation thin film transistor T3 is connected to the lower electrode Cst1 of the storage capacitor Cst, a first initialization drain electrode D4 of the first initialization thin film transistor T4, and the driving gate electrode GE1 of the driving thin film transistor T1. As the compensation thin film transistor T3 is turned on according to the scan signal Sn received through the scan line SL, the driving thin film transistor T1 is diode-connected by the compensation thin film transistor T3 connecting the driving gate electrode GE1 and the driving drain electrode D1 of the driving thin film transistor T1.

A first initialization gate electrode G4 of the first initialization thin film transistor T4 is connected to the previous scan line SL-1. A first initialization source electrode S4 of the first initialization thin film transistor T4 is connected to a second initialization drain electrode D7 of the second initialization thin film transistor T7 and the initialization voltage line VL. A first initialization drain electrode D4 of the first initialization thin film transistor T4 is connected to the lower electrode Cst1 of the storage capacitor Cst, the compensation drain electrode D3 of the compensation thin film transistor T3, and the driving gate electrode GE1 of the driving thin film transistor T1. As the first initialization thin film transistor T4 is turned on according to the previous scan signal Sn-1 received through the previous scan line SL-1, the first initialization thin film transistor T4 performs an initialization operation for initializing a voltage of the driving gate electrode GE1 of the driving thin film transistor T1 by transmitting the initialization voltage Vint to the driving gate electrode GE1 of the driving thin film transistor T1.

An operation control gate electrode G5 of the operation control thin film transistor T5 is connected to the emission control line EL. An operation control source electrode S5 of the operation control thin film transistor T5 is connected to the driving voltage line PL. An operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL. An emission control source electrode S6 of the emission control thin film transistor T6 is connected to the driving drain electrode D1 of the driving thin film transistor T1 and the compensation source electrode S3 of the compensation thin film transistor T3. An emission control drain electrode D6 of the emission control thin film transistor T6 is electrically connected to a second initialization source electrode S7 of the second initialization thin film transistor T7 and one electrode of the organic light-emitting device OLED.

As the operation control thin film transistor T5 and the emission control thin film transistor T6 are simultaneously turned on according to the emission control signal En received through the emission control line EL, the driving voltage ELVDD is transmitted to the organic light-emitting device OLED to allow the driving current $I_{OLED}$ to flow through the organic light-emitting device OLED.

A second initialization gate electrode G7 of the second initialization thin film transistor T7 is connected to the previous scan line SL-1. A second initialization source electrode S7 of the second initialization thin film transistor T7 is connected to the emission control drain electrode D6 of the emission control thin film transistor T6 and one electrode of the organic light-emitting device OLED. A second initialization drain electrode D7 of the second initialization thin film transistor T7 is connected to the first initialization source electrode S4 of the first initialization thin film transistor T4 and the initialization voltage line VL. As the second initialization thin film transistor T7 is turned on according to the previous scan signal Sn-1 received through the previous scan line SL-1, the second initialization thin film transistor T7 initializes the organic light-emitting device OLED.

Although FIG. 2B shows the first initialization thin film transistor T4 and the second initialization thin film transistor T7 connected to the previous scan line SL-1, embodiments are not limited thereto. According to another embodiment, the first initialization thin film transistor T4 may be connected to the previous scan line SL-1 and be driven according to the previous scan signal Sn-1, and the second initialization thin film transistor T7 may be connected to a separate signal line (for example, a next scan line) and be driven according to a signal transmitted to the signal line.

An upper electrode Cst2 of the storage capacitor Cst is connected to the driving voltage line PL, and an opposite electrode (cathode) of the organic light-emitting device OLED is connected to a common voltage ELVSS. Accordingly, the organic light-emitting device OLED may receive the driving current $I_{OLED}$ from the driving thin film transistor T1 and emit light, thereby displaying an image.

Although FIG. 2B shows the compensation thin film transistor T3 and the first initialization thin film transistor T4 each having a dual gate electrode, the compensation thin film transistor T3 and the first initialization thin film transistor T4 may each have one gate electrode.

Figure 3:
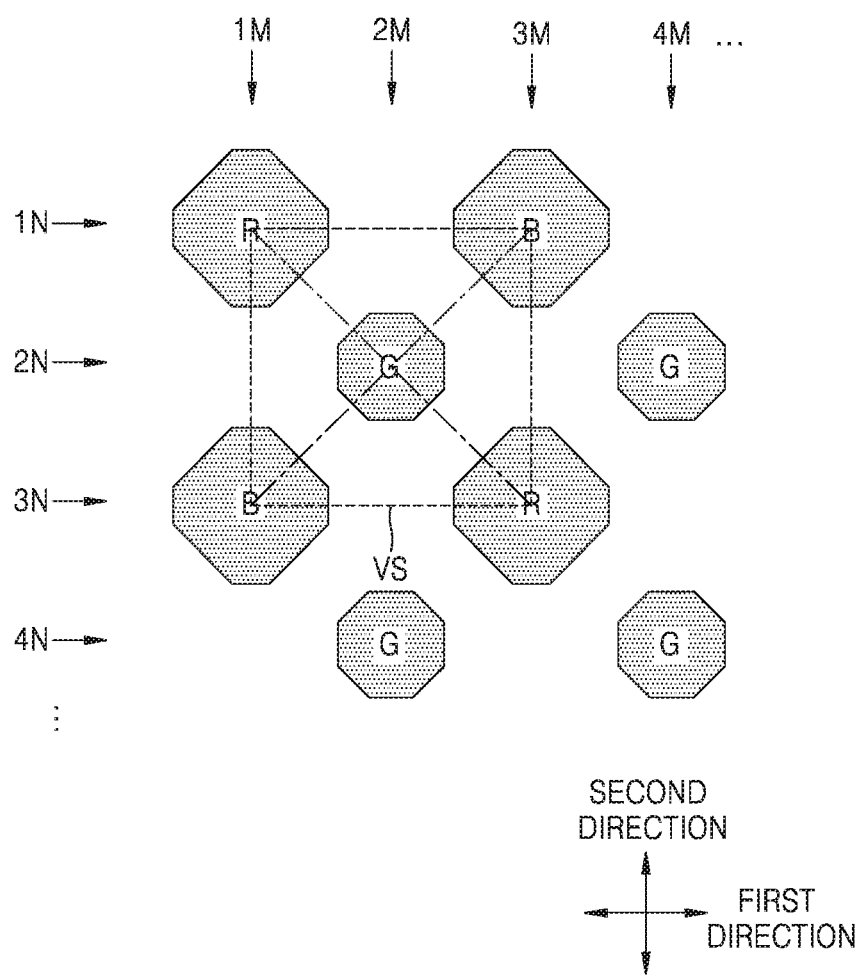
FIG. 3 is a schematic diagram of emission regions of a plurality of pixels of an organic light-emitting display apparatus according to an exemplary embodiment.

FIG. 3 is a schematic diagram of emission regions of a plurality of pixels R, G, and B of an organic light-emitting display apparatus according to an embodiment. In the present embodiment, a red pixel R, a green pixel G, and a blue pixel B indicate emission regions of respective pixels, and the emission regions may be defined by openings of a pixel-defining film. This will be described below.

Referring to FIG. 3, in a first row 1N, the red pixel R and the blue pixel B may be alternately arranged in a first direction, and in a second row 2N adjacent to the first row 1N, green pixels G may be spaced apart by a certain distance in the first direction. Likewise, in a third row 3N, the blue pixel B and the red pixel R may be alternately arranged, and in a fourth row 4N adjacent to the third row 3N, the green pixels G may be spaced apart by a certain distance. Such pixel arrangement may be repeated until a preset row.

The green pixels G arranged in the second row 2N and red pixels R and blue pixels B of the first row 1N may be arranged in a zigzag with respect to each other. Accordingly, in a first column 1M, the red pixel R and the blue pixel B may be alternately arranged in a second direction, and in a second column 2M, the green pixels G may be spaced apart by a certain distance in the second direction. Such pixel arrangement may be repeated until a preset column. In this regard, areas of the blue pixel B and the red pixel R may be larger than an area of the green pixel G. Alternatively, an area of the blue pixel B may be larger than areas of the red pixel R and the green pixel G.

In other words, in the above pixel arrangement structure, the red pixels R may be arranged on first and third vertices facing each other from among vertices of a virtual quadrilateral VS with a central point of the green pixel G as a central point of a quadrilateral, and the blue pixels B may be arranged on second and fourth vertices, which are the other vertices. In this regard, the virtual quadrilateral VS may be variously modified into a rectangle, a rhombus, a square, etc.

A pixel arrangement structure according to one or more embodiments is not limited thereto. For example, in FIG. 3, instead of the green pixel G, the blue pixel B may be arranged on the central point of the virtual quadrilateral VS, the red pixels R may be arranged on the first and third vertices facing each other from among the vertices of the virtual quadrilateral VS, and the green pixels G may be arranged on the second and fourth vertices, which are the other vertices.

Such a pixel arrangement structure is called a PenTile Matrix structure and allows implementation of high resolution with a small number of pixels by using rendering in which colors are represented by sharing neighboring pixels.

The pixel arrangement structure according to one or more embodiments is not limited to the PenTile Matrix structure. For example, one or more embodiments may be applied to a pixel arrangement structure having a stripe arrangement, a mosaic arrangement, or a delta arrangement. Further, one or more embodiments may also be applied to a pixel arrangement structure further including a white pixel emitting white light.

In the present embodiment, pixels may be classified into first to third pixels. In an embodiment, the first to third pixels may respectively correspond to the red pixel R, the blue pixel B, and the green pixel G.

Figure 4A:
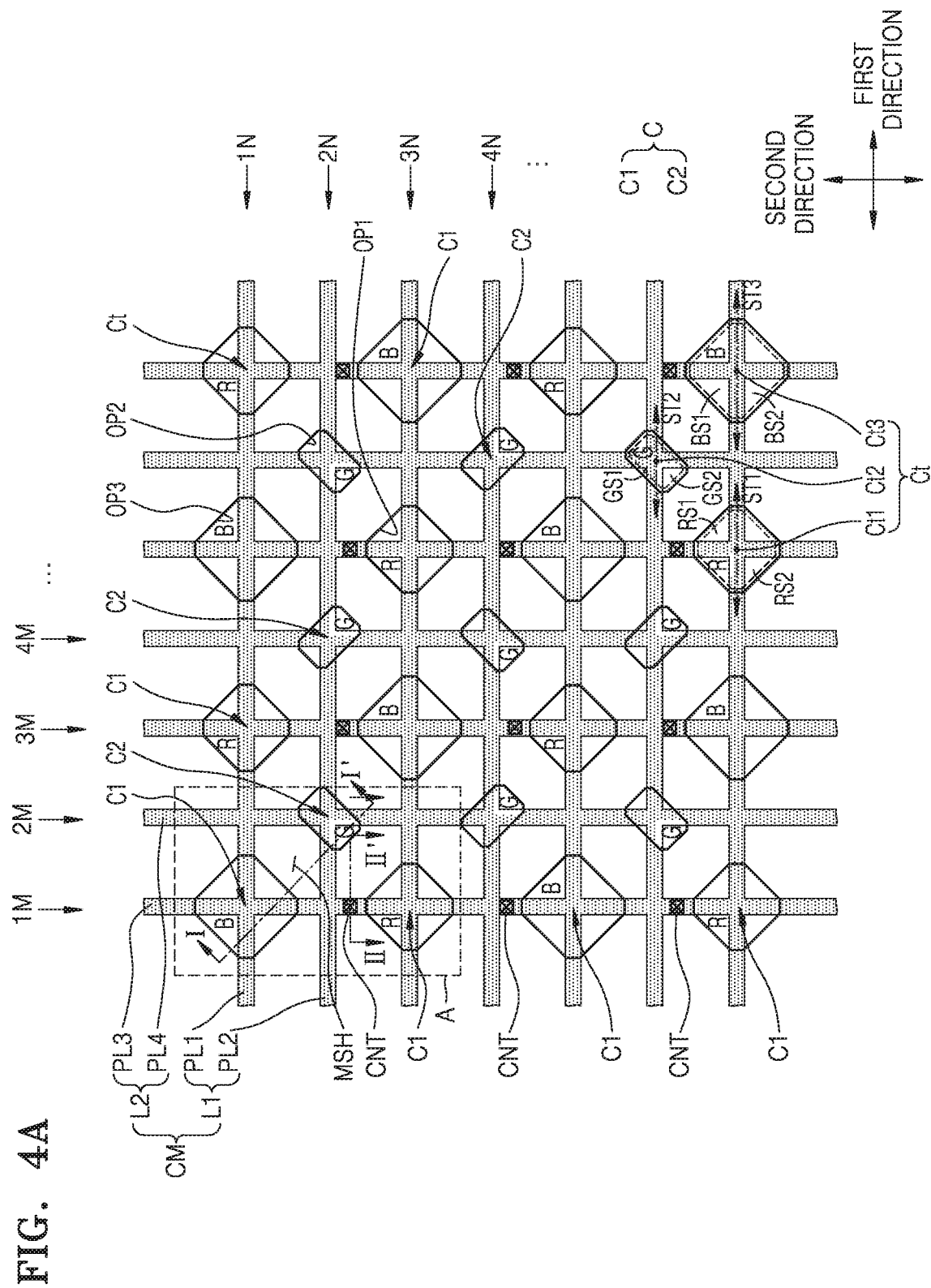
FIG. 4A is a diagram illustrating a relationship between emission regions of a plurality of pixels and a conductive layer.
Figure 4B:
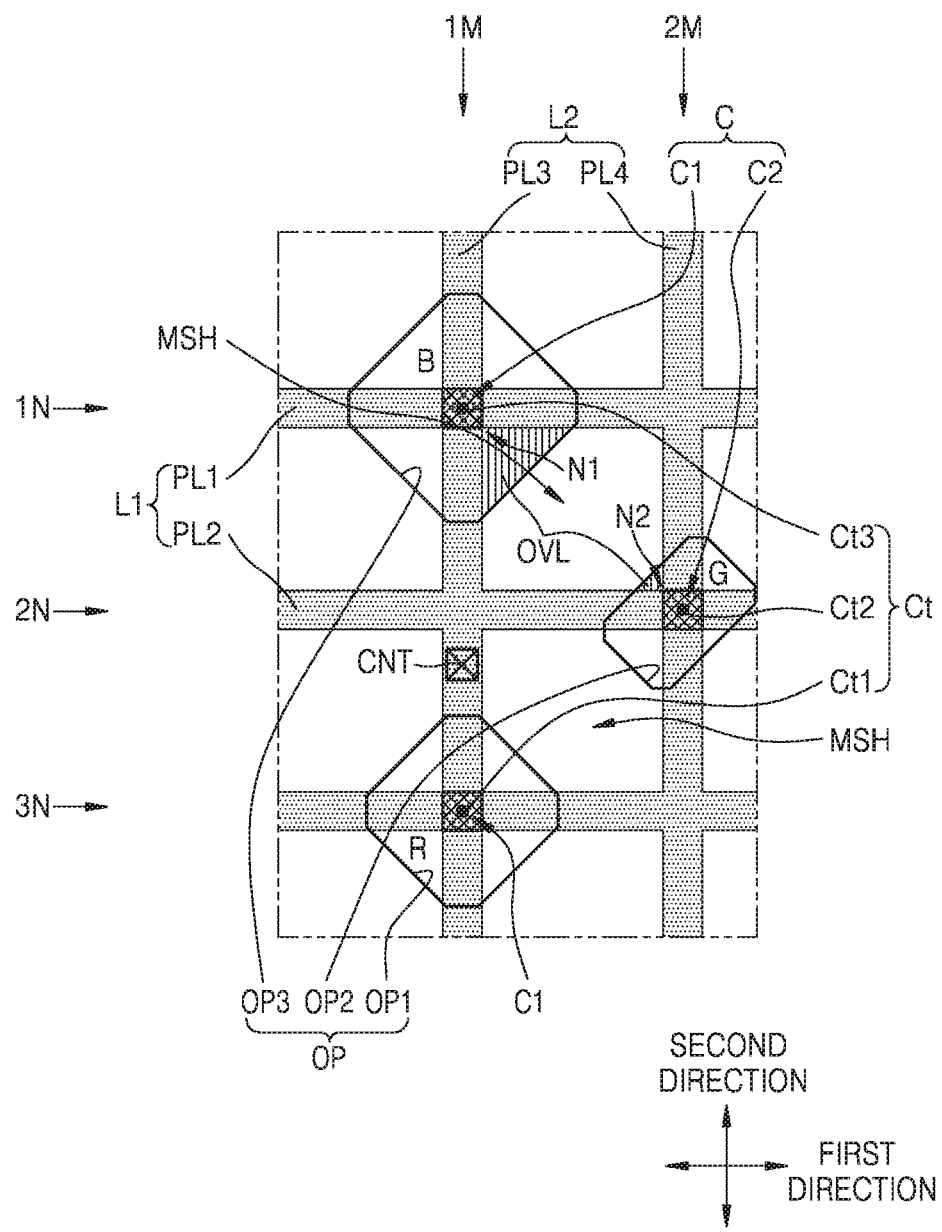
FIG. 4B is an enlarged view of portion A of FIG. 4A.

FIG. 4A is a diagram illustrating a relationship between emission regions of a plurality of pixels and a conductive layer. FIG. 4B is an enlarged view of portion A of FIG. 4A.

Referring to FIGS. 4A and 4B, an organic light-emitting display apparatus according to the present embodiment may include a plurality of pixels, and the plurality of pixels may be connected to a conductive layer CM.

The plurality of pixels may include a plurality of red pixels R, a plurality of green pixels G, and a plurality of blue pixels B. As described above, the plurality of pixels may be arranged in a PenTile structure.

In the present embodiment, the plurality of pixels may include emission regions OP, and the emission regions OP may be defined by openings of a pixel-defining film described below. In some embodiments, an emission region OP3 of the blue pixel B may be larger than an emission region OP1 of the red pixel R and an emission region OP2 of the green pixel G. However, one or more embodiments are not limited thereto. Various embodiments are possible, for example, the emission region OP1 of the red pixel R may be larger than the emission region OP3 of the blue pixel B and the emission region OP2 of the green pixel G.

Each of the emission regions OP (OP1, OP2, and OP3) may include a central point Ct of an emission region. A virtual straight line passing through the central point Ct of the emission region may halve a planar area of the emission region OP. For example, the emission region OP1 of a red pixel may include a central point Ct1 of an emission region of the red pixel. A first straight line ST1 passing through the central point Ct1 of the emission region of the red pixel in a first direction may halve a planar area of the emission region OP1 of the red pixel. Accordingly, two equally divided planar areas RS1 and RS2 of the emission region OP1 of the red pixel may be the same as each other. As another example, the emission region OP2 of a green pixel may include a central point Ct2 of an emission region of the green pixel. A second straight line ST2 passing through the central point Ct2 of the emission region of the green pixel in the first direction may halve a planar area of the emission region OP2 of the green pixel. Accordingly, two equally divided planar areas GS1 and GS2 of the emission region OP2 of the green pixel may be the same as each other. As another example, the emission region OP3 of a blue pixel may include a central point Ct3 of an emission region of the blue pixel. A third straight line ST3 passing through the central point Ct3 of the emission region of the blue pixel in the first direction may halve a planar area of the emission region OP3 of the blue pixel. Accordingly, two equally divided planar areas BS1 and BS2 of the emission region OP3 of the blue pixel may be the same as each other.

The conductive layer CM may include a plurality of first extension portions L1 and a plurality of second extension portions L2. The plurality of first extension portions L1 and the plurality of second extension portions L2 may be integrally provided.

The first extension portions L1 may extend in the first direction and may be connected to the plurality of pixels arranged in the same row. The first extension portions L1 may include a first wire portion PL1 and a second wire portion PL2 alternating with the first wire portion PL1. For example, the first wire portion PL1 extending along the first row 1N may be connected to the blue pixel B and the red pixel R alternately arranged. The second wire portion PL2 extending along the second row 2N may be connected to the green pixels G.

The second extension portions L2 may extend in a second direction and may be connected to the plurality of pixels arranged in the same column. The second extension portions L2 may include a third wire portion PL3 and a fourth wire portion PL4 alternating with the third wire portion PL3. For example, the third wire portion PL3 extending along the first column 1M may be connected to the blue pixel B and the red pixel R alternately arranged. The fourth wire portion PL4 extending along the second column 2M may be connected to the green pixels G.

The first extension portions L1 and the second extension portions L2 may cross each other to form cross portions C. The cross portions C may include first cross portions C1 and second cross portions C2. The first cross portions C1 may be formed as the third wire portion PL3 and the first extension portions L1 cross each other, and the second cross portions C2 may be formed as the fourth wire portion PL4 and the first extension portions L1 cross each other. For example, the third wire portion PL3 extending along the first column 1M may cross the first extension portions L1 extending in the first direction to form the first cross portions C1. Also, the fourth wire portion PL4 extending along the second column 2M may cross the first extension portions L1 arranged in the first direction to form the second cross portions C2.

Emission regions OP3 of blue pixels or emission regions OP1 of red pixels may each overlap one of the first cross portions C1. Emission regions OP2 of green pixels may each overlap one of the second cross portions C2. That is, the emission regions OP of the plurality of pixels may each overlap one of the cross portions C.

In the present embodiment, central points Ct of emission regions of the plurality of pixels may each overlap one of the cross portions C. Central points Ct3 of emission regions of blue pixels or central points Ct1 of emission regions of red pixels may each overlap one of the first cross portions C1, and central points Ct2 of emission regions of green pixels may each overlap one of the second cross portions C2.

From a different point of view, the conductive layer CM may have a mesh structure including mesh holes MSH formed by the first extension portions L1 and the second extension portions L2 crossing each other. A first corner portion N1 of the mesh holes MSH and a second corner portion N2 facing the first corner portion N1 may respectively form overlap portions OVL with respect to the emission regions OP of the plurality of pixels. In addition, the central points Ct of the emission regions of the plurality of pixels may overlap the conductive layer CM.

The conductive layer CM may contact a lower conductive layer UCM via a plurality of contact holes CNT. As the conductive layer CM contacts the lower conductive layer UCM, the conductive layer CM may provide the same voltage as the lower conductive layer UCM. For example, the lower conductive layer UCM and the conductive layer CM may be wires for transmitting the driving voltage ELVDD. As the conductive layer CM includes the first extension portions L1 and the second extension portions L2, the driving voltage ELVDD may be uniformly provided over the whole display area DA (Refer to FIG. 1).

In the present embodiment, such arrangement of the conductive layer CM may be introduced to reduce asymmetric color shift resulting from a side viewing angle. That is, symmetry of the emission regions OP of the plurality of pixels may be increased by designing the cross portions C of the first extension portions L1 and the second extension portions L2 to respectively overlap the emission regions OP of the plurality of pixels.

Figure 5A:
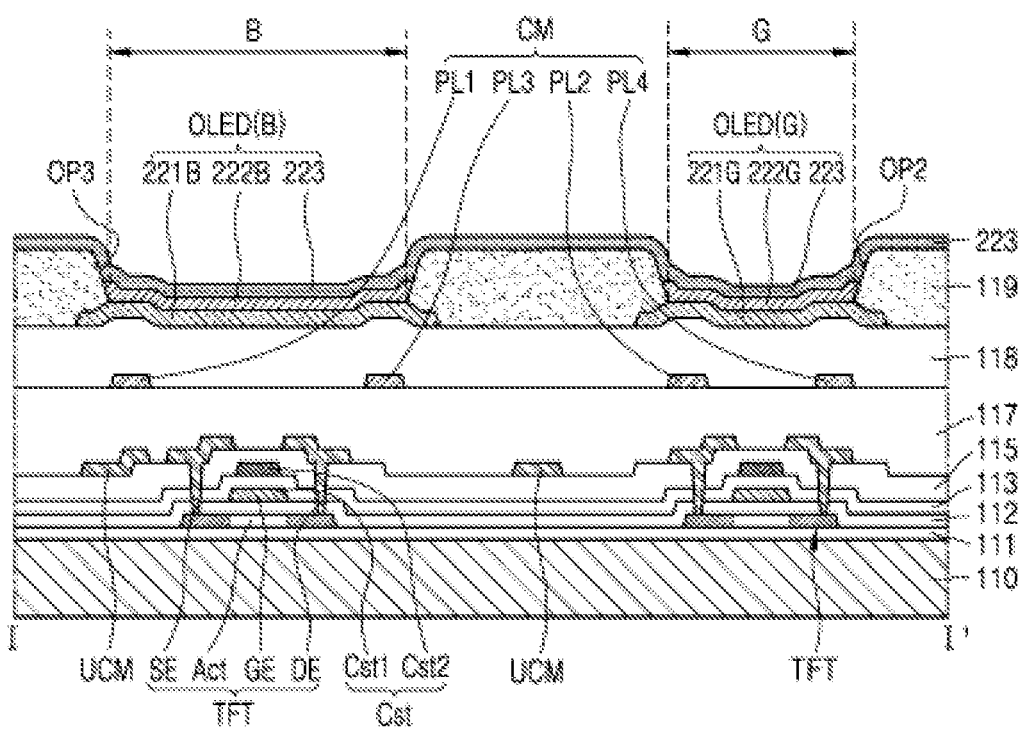
FIG. 5A is a cross-sectional view taken along line I-I' of FIG. 4A.
Figure 5B:
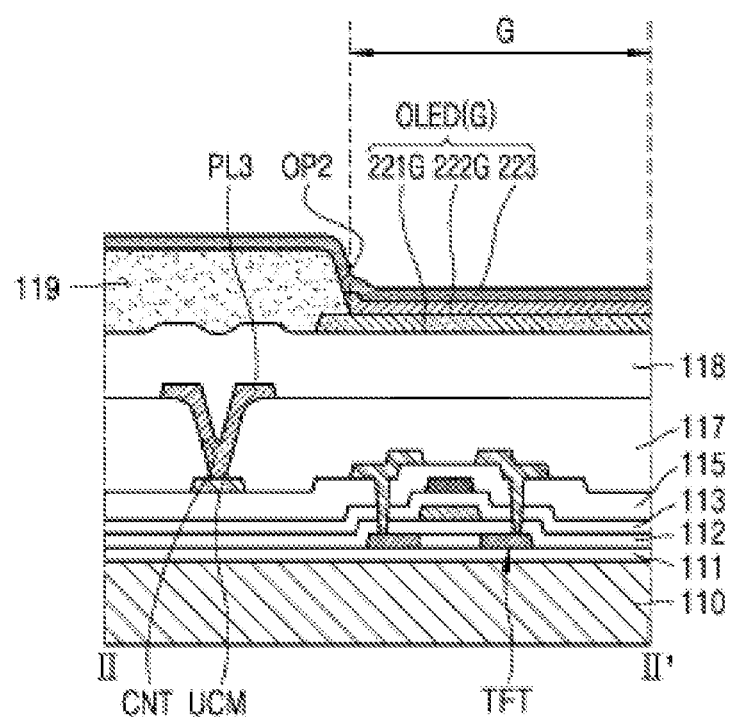
FIG. 5B is a cross-sectional view taken along line II-II' of FIG. 4A.

While a stack structure of an organic light-emitting display apparatus according to the present embodiment is examined, influence of the conductive layer CM will be hereinafter described with reference to FIGS. 5A and 5B. FIG. 5A is a cross-sectional view taken along line I-I' of FIG. 4A. FIG. 5B is a cross-sectional view taken along line II-II' of FIG. 4A.

A substrate 110 may include glass or polymer resin. The polymer resin may include polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP). The substrate 110 including polymer resin may be flexible, rollable, or bendable. The substrate 110 may have a multilayer structure including a layer including the polymer resin described above and an inorganic layer (not shown).

A buffer layer 111 may be on the substrate 110 and thus may decrease or prevent intrusion of foreign materials, moisture, or external air from the bottom of the substrate 110 and provide a planarized surface on the substrate 110. The buffer layer 111 may include an inorganic material such as oxide or nitride, an organic material, or an organic-inorganic complex material and may have a single-layer or multilayer structure including an inorganic material and an organic material. A barrier layer (not shown) for preventing intrusion of external air may be further included between the substrate 110 and the buffer layer 111. In some embodiments, the buffer layer 111 may include silicon oxide ($SiO_2$) or silicon nitride ($SiN_x$).

At least one thin film transistor TFT for each pixel R, G, and B may be arranged on the buffer layer 111. The thin film transistor TFT shown in FIGS. 5A and 5B may be one of the thin film transistors included in the pixel circuit PC of FIG. 2A or FIG. 2B. The thin film transistor TFT may include a semiconductor layer Act, a gate electrode GE, a source electrode, SE, and a drain electrode DE. In some cases, the source electrode SE and the drain electrode DE may be omitted. Also, the source electrode SE or the drain electrode DE may be connected to a data line for transmitting a data signal. The gate electrode GE may be connected to a scan line for transmitting a scan signal.

The semiconductor layer Act may be on the buffer layer 111 and may include polysilicon. According to another embodiment, the semiconductor layer Act may include amorphous silicon. According to another embodiment, the semiconductor layer Act may include oxide of at least one material selected from the group including indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer Act may include a channel region and source and drain regions on both sides of the channel region, the source and drain regions having a high carrier concentration. The source and drain regions may be formed by impurity doping.

A first gate insulating layer 112 may be provided to cover the semiconductor layer Act. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may be a single layer or multilayer including the inorganic insulating material described above.

The gate electrode GE may be arranged on the first gate insulating layer 112 to overlap the semiconductor layer Act. The gate electrode GE may include molybdenum (Mo), aluminum (Al), copper (Cu), titanium (Ti), etc. and may be a single layer or multilayer. For example, the gate electrode GE may be a single Mo layer.

A second gate insulating layer 113 may be provided to cover the gate electrode GE. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may be a single layer or multilayer including the inorganic insulating material described above.

The upper electrode Cst2 of the storage capacitor Cst may be on the second gate insulating layer 113. The upper electrode Cst2 may overlap the gate electrode GE below the upper electrode Cst2. In this regard, the gate electrode GE and the upper electrode Cst2 overlapping each other with the second gate insulating layer 113 therebetween may form the storage capacitor Cst. That is, the gate electrode GE may serve as the lower electrode Cst1 of the storage capacitor Cst.

This means that the storage capacitor Cst and the thin film transistor TFT may be formed to overlap each other. However, embodiments are not limited thereto. The storage capacitor Cst may be formed not to overlap the thin film transistor TFT.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W) and/or copper (Cu) and may be a single layer or multilayer including the material described above.

An interlayer insulating layer 115 may cover the upper electrode Cst2. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 115 may be a single layer or multilayer including the inorganic insulating material described above.

The source electrode SE and the drain electrode DE may be on the interlayer insulating layer 115. The source electrode SE and the drain electrode DE may include a conductive material including molybdenum (Mo), aluminum (Al), copper (Cu), titanium (Ti), etc. and may have a multilayer or single-layer structure including the material described above. For example, the source electrode SE and the drain electrode DE may have a multilayer structure of Ti/Al/Ti.

The lower conductive layer UCM may be further arranged on the interlayer insulating layer 115. That is, the lower conductive layer UCM may be on the same layer as the source electrode SE and the drain electrode DE and may include the same material as the source electrode SE and the drain electrode DE. The lower conductive layer UCM may include a conductive material including molybdenum (Mo), aluminum (Al), copper (Cu), titanium (Ti), etc. and may have a multilayer or single-layer structure including the material described above. The lower conductive layer UCM, which is a wire for transmitting the driving voltage ELVDD, may be arranged for each pixel B and G. The lower conductive layer UCM may overlap openings OP2 and OP3 of a pixel-defining film 119, which are emission regions of pixels. A first via layer 117 and a second via layer 118 are between the lower conductive layer UCM and pixel electrodes 221G and 221B, and thus, although the lower conductive layer UCM overlaps emission regions of pixels, there is no influence on the emission regions.

The first via layer 117 may cover the source electrode SE, the drain electrode DE, and the lower conductive layer UCM. The first via layer 117 may have a flat upper surface so that the conductive layer CM arranged thereon may be flat.

The first via layer 117 may have a single-layer or multilayer structure including a film including an organic material or an inorganic material. The first via layer 117 may include a general-purpose polymer such as benzocyclobutene (BCB), PI, hexamethyldisiloxane (HMDSO), poly(methyl methacrylate) (PMMA), or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof. The first via layer 117 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The conductive layer CM may be on the first via layer 117. The conductive layer CM may contact the lower conductive layer UCM via a contact hole CNT through the first via layer 117. Referring to FIG. 5B, the third wire portion PL3 of the conductive layer CM may contact the lower conductive layer UCM via the contact hole CNT.

The conductive layer CM may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W) and/or copper (Cu) and may be a single layer or multilayer including the material described above.

The second via layer 118 may cover the conductive layer CM. The second via layer 118 may have a single-layer or multilayer structure including a film including an organic material or an inorganic material. The second via layer 118 may include a general-purpose polymer such as BCB, PI, HMDSO, PMMA, or PS, a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof. The second via layer 118 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The pixel electrodes 221B and 221G may be on the second via layer 118. The pixel electrodes 221B and 221G may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to another embodiment, the pixel electrodes 221B and 221G may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to another embodiment, the pixel electrodes 221B and 221G may further include a film on/under the reflective film described above, the film including ITO, IZO, ZnO, or $In_2O_3$. In some embodiments, the pixel electrodes 221B and 221G may have a stack structure of ITO/Ag/ITO.

The pixel-defining film 119 may cover edges of each of the pixel electrodes 221B and 221G. The pixel-defining film 119 may have the openings OP2 and OP3 corresponding to respective pixels, that is, the openings OP2 and OP3 at least partially exposing the pixel electrodes 221B and 221G, and thus may define emission regions of pixels. That is, the openings OP2 and OP3 may be referred to as the emission regions OP of respective pixels.

The pixel-defining film 119 may prevent occurrence of an arc, etc. over edges of the pixel electrodes 221B and 221G by increasing a distance between the edges of the pixel electrodes 221B and 221G and an opposite electrode 223 over the pixel electrodes 221B and 221G. The pixel-defining film 119 may be formed by using a method such as spin coating, with an organic insulating material such as PI, polyamide, acrylic resin, BCB, HMDSO, and phenolic resin.

Intermediate layers 222G and 222B including an organic emission layer may be on the pixel electrodes 221B and 221G exposed by the openings OP2 and OP3 of the pixel-defining film 119. The intermediate layers 222G and 222B may include a low-molecular weight or polymer material. When the intermediate layers 222G and 222B include a low-molecular weight material, the intermediate layers 222G and 222B may have a hole injection layer (HIL), a hole transport layer (HTL), an emission layer (EML), an electron transport layer (ETL), an electron injection layer (EIL), etc. stacked in a single or complex structure, and may include various organic materials, including copper phthalocyanine (CuPc), N,N'-Di(naphthalene-1-yl)-N,N'-diphenyl-benzidine (NB), tris-8-hydroxyquinoline aluminum ($Alq_3$), etc. Such layers may be formed by vacuum deposition.

When the intermediate layers 222G and 222B include a polymer material, the intermediate layers 222G and 222B may generally have a structure including an HTL and an EML. In this regard, the HTL may include PEDOT, and the EML may include a polymer material such as a poly-phenylenevinylene (PPV)-based polymer material and a polyfluorene-based polymer material. The intermediate layers 222G and 222B may be formed by screen printing, inkjet printing, or laser induced thermal imaging (LITI).

The intermediate layers 222G and 222B are not limited thereto and may have various structures. In addition, the intermediate layers 222G and 222B may include an integral layer over a plurality of pixel electrodes 221G and 221B or may include a layer patterned to correspond to each of the plurality of pixel electrodes 221G and 221B.

The opposite electrode 223 may be on the intermediate layers 222G and 222B. The opposite electrode 223 may include a conductive material having a low work function. For example, the opposite electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrode 223 may further include a layer, such as ITO, IZO, ZnO, or $In_2O_3$, on the (semi)transparent layer including the material described above.

The opposite electrode 223 may be integrally formed over a plurality of organic light-emitting devices OLED(G) and OLED(B) to correspond to the plurality of pixel electrodes 221G and 221B.

Although not shown, a capping layer for protecting the opposite electrode 223 and increasing light extraction efficiency may be on the opposite electrode 223. The capping layer may include LiF. Alternatively, the capping layer may include an inorganic insulating material such as silicon nitride and/or may include an organic insulating material. In some embodiments, the capping layer may be omitted.

Also, an organic light-emitting display apparatus according to the present application may further include a sealing member for protecting a plurality of organic light-emitting devices OLED from external air.

The sealing member may include a thin film encapsulation layer including at least one inorganic encapsulation layer and at least one organic encapsulation layer. In this regard, the inorganic encapsulation layer may include one or more inorganic insulating materials from among aluminum oxide, titanium oxide, tantalum oxide, hafnium oxide, zinc oxide, silicon oxide, silicon nitride, and silicon oxynitride. The organic encapsulation layer may include a polymer-based material. The polymer-based material may include acrylic resin, epoxy-based resin, PI, and polyethylene. The thin film encapsulation layer may include a first inorganic encapsulation layer, an organic encapsulation layer, and a second inorganic encapsulation layer in a stacked structure.

Alternatively, a sealing substrate, which is bonded to the substrate 110 by a sealant or a frit, may be used as the sealing member.

Components such as an input sensing member for sensing a touch input, a reflection-preventing member including a polarizer and a retarder or a color filter and a black matrix, and a transparent window may be further arranged on the sealing member.

In the present embodiment, the conductive layer CM overlaps the openings OP2 and OP3 of the pixel-defining film 119. Along a shape of the conductive layer CM, a curve may be vertically formed over an upper surface of the second via layer 118. Such a curve may affect the pixel electrodes 221B and 221G and/or the intermediate layers 222B and 222G and the opposite electrode 223 of the plurality of pixels.

A curve or step formed inside the emission region may cause diffused reflection or vertical/horizontal asymmetric reflection of light generated in the intermediate layers 222B and 222G, and accordingly, color visibility according to a viewing angle (azimuth angle) may vary.

Figure 6:
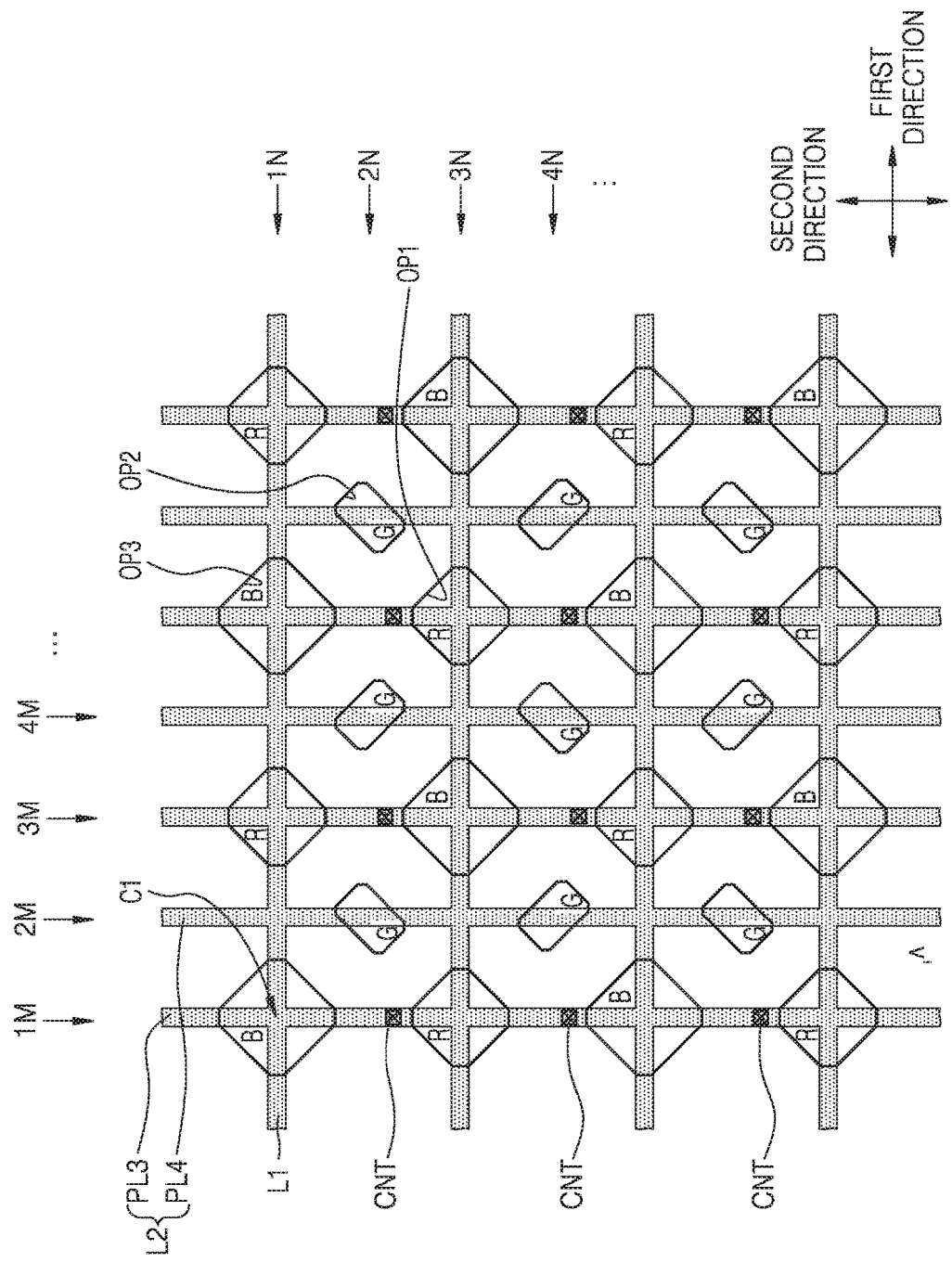
FIG. 6 is a diagram according to a comparison example for comparison with an exemplary embodiment.

As shown in a comparative example of FIG. 6, when the first extension portions L1 do not pass the emission region OP2 of the green pixel, no second cross portions C2 may be formed as the first extension portions L1 and the fourth wire portion PL4 cross each other. Thus, while the conductive layer CM is arranged below the red pixel R and the blue pixel B in the first and second directions, with respect to the green pixel G, the conductive layer M may be arranged only in the second direction. Arrangement of the conductive layer CM overlapping the emission region OP of each pixel may be different between the red and blue pixels R and B and the green pixel G. That is, a curve or step formed inside the red pixel R and the blue pixel B may be different from a curve or step formed inside the green pixel G. Accordingly, color shift according to a viewing angle (azimuth angle) may increase.

In order to reduce such a phenomenon, in the present embodiment, the first extension portions L1 and the second extension portions L2 are arranged to overlap each other over the emission region OP of each pixel. Also, the central points Ct of the emission regions of the plurality of pixels are respectively included in the cross portions C of the first extension portions L1 and the second extension portions L2. That is, arrangement of the conductive layer CM overlapping the emission regions OP of the plurality of pixels may be identical. As curves or steps formed inside the emission regions due to the conductive layer CM form symmetry, color shift according to an azimuth angle may decrease.

FIG. 7 is a schematic diagram of an organic light-emitting display apparatus according to another embodiment. In FIG. 7, elements that are the same as those in FIGS. 4A and 6 are designated by the same reference numerals, and thus, a repeated description thereof is omitted.

Referring to FIG. 7, an organic light-emitting display apparatus according to another embodiment may include a plurality of pixels, and the plurality of pixels may be connected to the conductive layer CM. The first extension portions L1 may include the first wire portion PL1 and the second wire portion PL2 alternating with the first wire portion PL1.

In the present embodiment, the first wire portion PL1 may overlap the emission region OP3 of a blue pixel or the emission region OP1 of a red pixel. The second wire portion PL2 may overlap the emission region OP2 of a green pixel and may include a first sub-portion PLS1 and a second sub-portion PLS2 spaced apart in a first direction. The first wire portion PL1 and the third wire portion PL3 may cross each other to form the cross portions C. The second wire portion PL2 and the third wire portion PL3 may not cross each other. Accordingly, the conductive layer CM may be arranged below the emission region OP2 of the green pixel to have a cross (+) shape.

From a different point of view, the conductive layer CM may have a mesh structure including the mesh holes MSH formed by the first extension portions L1 and the second extension portions L2 crossing each other, and at least one first mesh hole MSH1 and a second mesh hole MSH2 adjacent to the first mesh hole MSH1 from among the mesh holes MSH may be connected to each other in a second direction.

Arrangement of the conductive layer CM within the emission regions OP of the plurality of pixels may be identical. As curves or steps formed inside the emission regions OP due to the conductive layer CM form symmetry, color shift according to a viewing angle (azimuth angle) may decrease.

Hereinafter, the effect of a conductive layer symmetrically arranged within emission regions of a plurality of pixels will be described through simulation results.

Figure 8A:
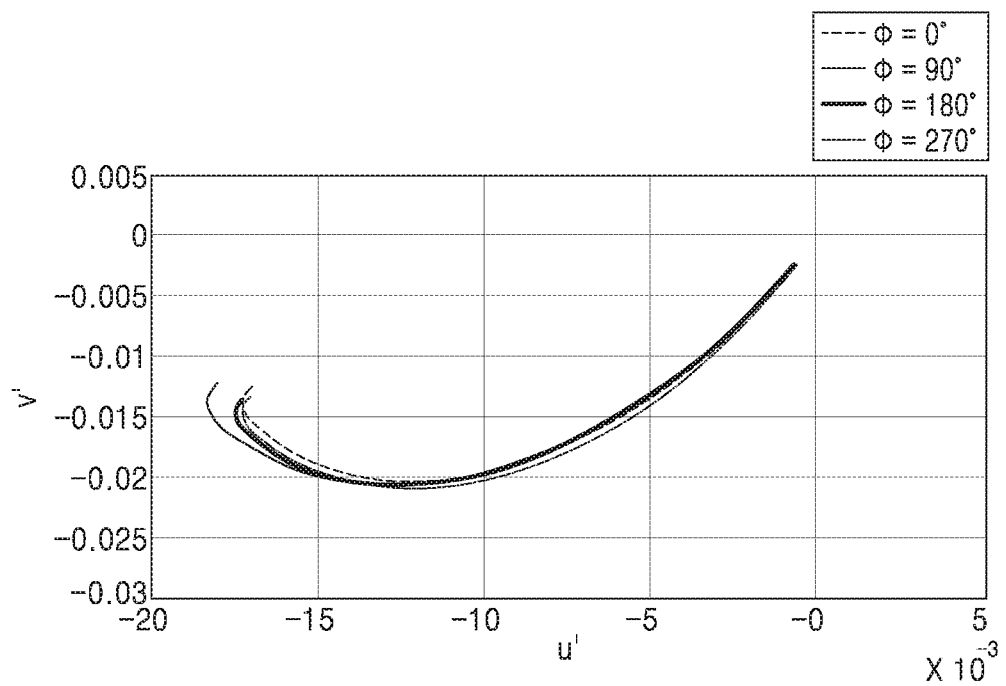
FIG. 8A is a simulation result according an exemplary embodiment.
Figure 8B:
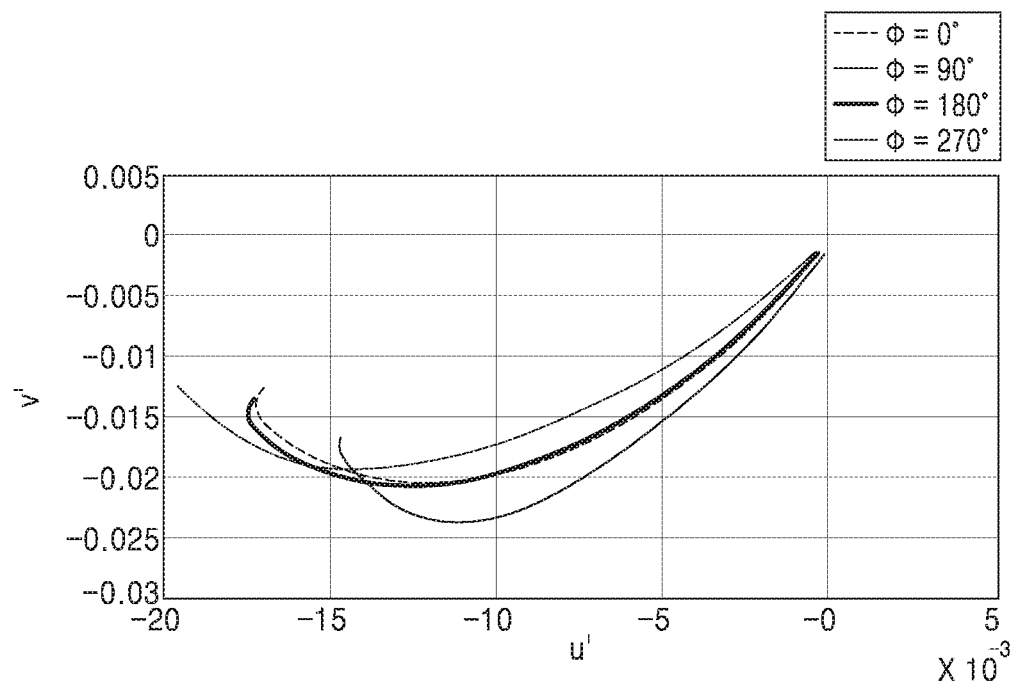
FIG. 8B is a simulation result according to a comparison example for comparison with an exemplary embodiment.

FIG. 8A is a simulation result for color shift according an embodiment. FIG. 8B is a simulation result for color shift according to a comparison example (the embodiment of FIG. 6).

FIG. 8A shows a white angle difference (WAD) change result at a given viewing angle (azimuth angle) compared to reference color coordinates. The above simulation result shows a change of WAD being constant according to a viewing angle (azimuth angle).

Referring to FIG. 8B, it may be found out that a change of WAD is different from that in the present embodiment according to a viewing angle (azimuth angle) compared to reference color coordinates. Particularly, a WAD change difference in a vertical direction (90 degrees-270 degrees) is significant.

According to the present embodiment, steps of the conductive layer CM may be symmetrically formed within a plurality of emission regions to decrease a WAD change according to a viewing angle (azimuth angle). According to the present embodiment, color shift compared to reference color coordinates may be decreased by 75% compared with the comparison example.

According to one or more embodiments, while uniform characteristics between pixels are maintained, an asymmetric color shift phenomenon may be decreased and uniformity of WAD may be obtained.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light-emitting display apparatus in which a plurality of pixels are arranged in a first direction and a second direction crossing the first direction, comprising:
   an organic light-emitting device disposed on a substrate, wherein the organic light-emitting device is comprised in each of the plurality of pixels;
   a pixel-defining film covering edges of a pixel electrode of the organic light-emitting device and having an opening configured to expose a portion of the pixel electrode to define an emission region; and a conductive layer disposed between the substrate and the organic light-emitting device, wherein:

the conductive layer comprises first extension portions extending in the first direction and second extension portions extending in the second direction, the emission region of each of the plurality of pixels overlaps one of cross portions where the first extension portions and the second extension portions cross each other, the plurality of pixels comprise a first pixel, a second pixel, and a third pixel emitting different colors of light from one another, emission regions of the first pixel, emission regions of the second pixel, and emission regions of the third pixel each overlap the cross portions, the first pixel and the second pixel are alternately arranged in the first direction and the second direction, and the third pixel is disposed at a central point of a virtual quadrilateral having a central point of the first pixel and a central point of the second pixel as vertices.

2. The organic light-emitting display apparatus of claim 1, further comprising:

a thin film transistor disposed on the substrate; and a first via layer and a second via layer stacked between the thin film transistor and the organic light-emitting device, wherein:

the conductive layer is disposed between the first via layer and the second via layer, the second extension portions each comprise a third wire portion and a fourth wire portion alternating with the third wire portion, the third wire portion comprises first cross portions crossing the first extension portions, and wherein the emission regions of the first pixel or the emission regions of the second pixel each overlap one of the first cross portions.

3. The organic light-emitting display apparatus of claim 2, wherein central points of the emission regions of the first pixel or central points of the emission regions of the second pixel each overlap one of the first cross portions.

4. The organic light-emitting display apparatus of claim 1, further comprising:

a thin film transistor over the substrate; and a first via layer and a second via layer stacked between the thin film transistor and the organic light-emitting device, wherein:

the conductive layer is disposed between the first via layer and the second via layer, the second extension portions each comprise a third wire portion and a fourth wire portion alternating with the third wire portion, the fourth wire portion comprises second cross portions crossing the first extension portions, and the emission regions of the third pixel each overlap one of the second cross portions.

5. The organic light-emitting display apparatus of claim 4, wherein central points of the emission regions of the third pixel respectively overlap the second cross portions.

6. The organic light-emitting display apparatus of claim 1, wherein the conductive layer comprises a wire for transmitting a driving voltage to the plurality of pixels.

7. The organic light-emitting display apparatus of claim 1, wherein the first direction and the second direction are perpendicular to each other.

8. The organic light-emitting display apparatus of claim 1, wherein a central point of the emission region of each of the plurality of pixels overlaps one of the cross portions.

9. The organic light-emitting display apparatus of claim 8, wherein:

a central point of an emission region of the first pixel, a central point of an emission region of the second pixel, and a central point of an emission region of the third pixel each overlap one of the cross portions.

10. The organic light-emitting display apparatus of claim 1, wherein the plurality of pixels are arranged in a pentile matrix structure.

11. The organic light-emitting display apparatus of claim 1, further comprising:

a first via layer and a second via layer disposed between the substrate and the pixel electrode; and a lower conductive layer disposed between the substrate and the first via layer, wherein:

the conductive layer is disposed between the first via layer and the second via layer, and the conductive layer is configured to contact the lower conductive layer via a contact hole.

12. An organic light-emitting display apparatus in which a plurality of pixels are arranged in a first direction and a second direction crossing the first direction, comprising:

an organic light-emitting device disposed on a substrate, wherein the organic light-emitting device is comprised in each of the plurality of pixels;

a pixel-defining film covering edges of a pixel electrode of the organic light-emitting device and having an opening configured to expose a portion of the pixel electrode to define an emission region; and a conductive layer disposed between the substrate and the organic light-emitting device, wherein:

the conductive layer comprises first extension portions extending in the first direction and second extension portions extending in the second direction, the emission region of each of the plurality of pixels overlaps one of cross portions where the first extension portions and the second extension portions cross each other, the plurality of pixels comprise a first pixel, a second pixel, and a third pixel emitting different colors of light from one another, emission regions of the first pixel, emission regions of the second pixel, and emission regions of the third pixel each overlap the cross portions, the first extension portions comprise first wire portions and second wire portions alternating with the first wire portions, the emission regions of the first pixel or the emission regions of the second pixel each overlap one of the first wire portions, the emission regions of the third pixel each overlap one of the second wire portions, and the second wire portions each comprise a first sub-portion and a second sub-portion spaced apart from each other in the first direction.

13. An organic light-emitting display apparatus in which a plurality of pixels are arranged in a first direction and a second direction crossing the first direction, comprising:
   an organic light-emitting device disposed on a substrate, wherein the organic light-emitting device is comprised in each of the plurality of pixels;
   a pixel-defining film covering edges of a pixel electrode of the organic light-emitting device and having an opening configured to expose a portion of the pixel electrode to define an emission region;
   a first via layer and a second via layer disposed between the substrate and the pixel electrode; and
   a conductive layer disposed between the first via layer and the second via layer, wherein the conductive layer has a mesh structure comprising mesh holes formed by first extension portions and second extension portions crossing each other,
   wherein emission regions of the plurality of pixels comprise overlap portions with respect to a first corner portion of the mesh holes and a second corner portion facing the first corner portion, respectively, and
   wherein a lower surface of the pixel electrode over the conductive layer comprises a curve.

14. The organic light-emitting display apparatus of claim 13, wherein
   central points of the emission regions of the plurality of pixels overlap the conductive layer.

15. The organic light-emitting display apparatus of claim 13, wherein
   the plurality of pixels comprise a first pixel, a second pixel, and a third pixel emitting different colors of light from one another.

16. The organic light-emitting display apparatus of claim 13, wherein
   at least one first mesh hole and a second mesh hole adjacent to the first mesh hole from among the mesh holes are connected to each other in the second direction.

17. The organic light-emitting display apparatus of claim 13, further comprising:
   a lower conductive layer disposed between the substrate and the first via layer,
   wherein:
   the conductive layer is disposed between the first via layer and the second via layer, and
   the conductive layer is configured to contact the lower conductive layer via a contact hole.

* * * * *